(12) United States Patent
Jeong et al.

(10) Patent No.: US 10,490,259 B2
(45) Date of Patent: Nov. 26, 2019

(54) INTEGRATED CIRCUIT

(71) Applicants: SK hynix Inc., Gyeonggi-do (KR); Seoul National University R&DB Foundation, Seoul (KR)

(72) Inventors: Deog-Kyoon Jeong, Seoul (KR); Jung Min Yoon, Seoul (KR); Hyungrok Do, Seoul (KR)

(73) Assignees: SK hynix Inc., Gyeonggi-do (KR); Seoul National R&DB Foundation, Seoul (KR)

( * ) Notice: Subject to any disclaimer, the term of this patent is extended or adjusted under 35 U.S.C. 154(b) by 0 days.

(21) Appl. No.: 15/941,194

(22) Filed: Mar. 30, 2018

(65) Prior Publication Data

US 2019/0013060 A1     Jan. 10, 2019

(30) Foreign Application Priority Data

Jul. 5, 2017     (KR) ........................ 10-2017-0085519

(51) Int. Cl.
*G11C 11/4091*     (2006.01)
*H03F 3/45*     (2006.01)
(Continued)

(52) U.S. Cl.
CPC .......... *G11C 11/4091* (2013.01); *G11C 7/065* (2013.01); *G11C 7/08* (2013.01);
(Continued)

(58) Field of Classification Search
CPC ........................ G11C 11/4091; G11C 11/4094
See application file for complete search history.

(56) References Cited

U.S. PATENT DOCUMENTS 5,241,497 A * 8/1993 Komarek ............... G11C 7/062
                                                    257/E27.103
5,414,663 A * 5/1995 Komarek ............... G11C 7/062
                                                    257/E27.103
(Continued)

FOREIGN PATENT DOCUMENTS

KR     101277480     6/2013

OTHER PUBLICATIONS

Moon, J. et al., Sense Amplifier with Offset Mismatch Calibration for Sub 1-V DRAM Core Operation, IEEE, pp. 3501-3504, 2010.

*Primary Examiner* — Hoai V Ho
*Assistant Examiner* — Jay W. Radke
(74) *Attorney, Agent, or Firm* — IP & T Group LLP

(57) ABSTRACT

An integrated circuit includes: an amplifier circuit including a first inverter and a second inverter to amplify a voltage difference between a first line and a second line; a replica amplifier circuit including a first replica inverter having an input terminal and an output terminal which are coupled to a second replica line and replicating the first inverter, and that includes a second replica inverter having an input terminal and an output terminal which are coupled to a first replica line and replicating the second inverter; and a current control circuit suitable for controlling an amount of a current sourced to the replica amplifier circuit and an amount of a current sunken from the replica amplifier circuit based on comparison of an average level between a voltage of the first replica line and a voltage of the second replica line with a level of a target voltage.

19 Claims, 10 Drawing Sheets

(51) Int. Cl.
  *G11C 11/4099* (2006.01)
  *H03F 1/02* (2006.01)
  *G11C 11/4094* (2006.01)
  *G11C 7/06* (2006.01)
  *G11C 7/08* (2006.01)
  *G11C 7/22* (2006.01)
  *G11C 11/4076* (2006.01)

(52) U.S. Cl.
  CPC .......... *G11C 7/227* (2013.01); *G11C 11/4076* (2013.01); *G11C 11/4094* (2013.01); *G11C 11/4099* (2013.01); *H03F 1/0216* (2013.01); *H03F 3/45264* (2013.01); *H03F 2200/375* (2013.01); *H03F 2200/453* (2013.01); *H03F 2200/87* (2013.01); *H03F 2203/45588* (2013.01); *H03F 2203/45681* (2013.01)

(56) References Cited

U.S. PATENT DOCUMENTS 5,650,979 A * 7/1997 Komarek ............... G11C 7/065
　　　　　　　　　　　　　　　　　　　　365/189.08
5,793,698 A * 8/1998 Komarek ............... G11C 7/065
　　　　　　　　　　　　　　　　　　　　365/194

* cited by examiner

INTEGRATED CIRCUIT

CROSS-REFERENCE TO RELATED APPLICATIONS

The present application claims priority to Korean Patent Application No. 10-2017-0085519, filed on Jul. 5, 2017, which is incorporated herein by reference in its entirety.

BACKGROUND

1. Field

Exemplary embodiments of the present invention relate to a circuit designing technology. Particularly, exemplary embodiments relate to an amplifier circuit for amplifying a voltage difference between two electrical lines.

2. Description of the Related Art

The basic operation of a memory device includes writing data inputted from the outside of the device and reading out the data written (stored or programmed) in the device. The basic unit for storing data in a semiconductor device may be referred to as a cell. A memory device stores one piece of data in one storage medium such as, e.g., a capacitor. To read out the data stored in the storage medium and transfer the read data to an external device correctly, the polarity of the data stored in a cell has to be decided accurately. Therefore, a memory device typically includes an amplifier circuit for deciding/amplifying data such as, e.g., a bit line sense amplifier (BLSA).

FIG. 1 is a schematic diagram illustrating a conventional bit line sense amplifier 100.

Referring to FIG. 1, the bit line sense amplifier 100 may include a first inverter 110 and a second inverter 120 that are coupled to each other in a cross-coupled form between a bit line BL and a bit line bar BLB. For the sake of convenience in description, a memory cell CELL11 on the side of the bit line BL and a memory cell CELL12 on the side of the bit line bar BLB are illustrated along with the bit line sense amplifier 100.

Before the amplification operation of the bit line sense amplifier 100, the bit line BL and the bit line bar BLB, which may be referred to as a bit line pair BL and BLB, may be pre-charged with the same voltage level. When a $0^{th}$ word line WL0 is enabled, a charge sharing operation where the data stored in a capacitor C11 flows into the bit line BL through the channel of a cell transistor T11 of the memory cell CELL11 coupled to the $0^{th}$ word line WL0 may be performed. By the charge sharing operation, the voltage level of the bit line BL may become slightly higher or lower than a pre-charge voltage level based on the logic value of the data. Herein, the bit line bar BLB may maintain the pre-charge voltage level as it is.

After the charge sharing operation, a pull-up voltage is supplied to the pull-up voltage terminal RTO of the bit line sense amplifier 100, and a pull-down voltage is supplied to the pull-down voltage terminal SB of the bit line sense amplifier 100 so as to enable the bit line sense amplifier 100. In other words, the bit line sense amplifier 100 can recognize the potential difference between the bit line BL and the bit line bar BLB and amplify a high voltage level to be even higher and amplify a low voltage level to be even lower.

Ideally, if there is a potential difference dV between both ends of the bit line pair, the bit line sense amplifier 100 may be able to accurately sense and amplify the potential difference dV between both ends of the bit line pair, which is, however, often not true in reality. The minimal value of the potential difference dV between both ends of the bit line pair BL and BLB that is needed for the bit line sense amplifier 100 to accurately operate is referred to as an offset voltage. When the potential difference dV between both ends of the bit line pair is smaller than the offset voltage, the bit line sense amplifier 100 may not accurately perform an amplification operation and a sense operation. Among the factors that cause the offset voltage as described above is a mismatch between the first inverter 110 and the second inverter 120. The PMOS transistors 111 and 121 and the NMOS transistors 112 and 122 of the first inverter 110 and the second inverter 120 in charge of the sense and amplification operations may have to be formed identically. In reality, however, a mismatch may be caused and present for a number of reasons: e.g., the structural layout of the inverters may not be drawn exactly symmetrically; even if the layout is drawn symmetrically, patterns may not be formed identically; and contacts may not be defined identically.

FIG. 2 is a schematic diagram illustrating a conventional bit line sense amplifier 200, which compensates the offset caused by a mismatch. The bit line sense amplifier 200 of FIG. 2 is disclosed in an article entitled "Sense Amplifier with Offset Mismatch Calibration for Sub 1-V DRAM Core Operation" by MOON, Jinyeong and Byoungtae CHUNG, Proceedings of 2010 IEEE International Symposium on Circuits and Systems, IEEE, 2010.

The bit line sense amplifier 200 of FIG. 2 may further include first to fourth switches 231 to 234 in addition to a first inverter 210 and a second inverter 220. The input terminal of the first inverter 210 may be coupled to a bit line bar BLB, and the input terminal of the second inverter 220 may be coupled to a bit line BL. The first switch 231 may be coupled between the input terminal and the output terminal of the first inverter 210, and the second switch 232 may be coupled between the input terminal and the output terminal of the second inverter 220. The third switch 233 may be coupled between the output terminal of the first inverter 210 and the bit line BL, and the fourth switch 234 may be coupled between the output terminal of the second inverter 220 and the bit line bar BLB. The first switch 231 and the second switch 232 may be turned on/off in response to a first phase signal φ1 which is enabled in a first phase, and the third switch 233 and the fourth switch 234 may be turned on/off in response to a second phase signal φ2 which is enabled in a second phase.

Before the amplification operation of the bit line sense amplifier 200, the bit line BL and the bit line bar BLB, which may be referred to as a bit line pair BL and BLB, may be pre-charged with the same voltage level.

After the pre-charge of the bit line pair BL and BLB, a first phase operation may be performed to cancel the offset due to mismatch of the first inverter 210 and the second inverter 220. During the first phase operation, the first phase signal φ1 may be enabled to turn on the first switch 231 and the second switch 232, and as the second phase signal φ2 may be disabled to turn off the third switch 233 and the fourth switch 234. A pull-up voltage may be supplied to the pull-up voltage terminal RTO, and a pull-down voltage may be supplied to the pull-down voltage terminal SB. In this way, the input terminal and output terminal of the first inverter 210 may be coupled to the bit line bar BLB, and the input terminal and output terminal of the second inverter 220 may be coupled to the bit line BL. As a result, a voltage corresponding to a type of an equilibrium state (i.e., a trip point) reflecting the offset of the transistors 211 and 212 of the first inverter 210 is stored in the bit line bar BLB, and a voltage corresponding to a type of an equilibrium state reflecting the offset of the transistors 221 and 222 of the second inverter 220 is stored in the bit line BL.

After the first phase operation, a charge sharing operation may be performed. During the charge sharing operation, the first phase signal φ1 and the second phase signal φ2 are all disabled so as to keep all the first to fourth switches 231 to 234 in an off state. When the $0^{th}$ word line WL0 is enabled in this state, a charge sharing operation where the data stored in a capacitor C21 flows into the bit line BL through a channel of a cell transistor T21 of the memory cell CELL21 coupled to the $0^{th}$ word line WL0 may be performed. By the charge sharing operation, the voltage level of the bit line BL may become slightly higher or lower than the voltage level of the equilibrium state which is stored in the bit line BL in the first phase operation based on the logic value of the data.

Then, a second phase operation for amplification may be performed. During the second phase operation, the second phase signal φ2 may be enabled so as to turn on the third switch 233 and the fourth switch 234, and the first phase signal φ1 may be disabled so as to turn off the first switch 231 and the second switch 232. Also, the first inverter 210 and the second inverter 220 may be enabled as the pull-up voltage is supplied to the pull-up voltage terminal RTO, and the pull-down voltage is supplied to the pull-down voltage terminal SB. Since the inverters 210 and 220 are coupled in a cross-coupled form between the bit line BL and the bit line bar BLB during the second phase operation, the voltage difference between the bit line BL and the bit line bar BLB may be amplified.

Since a charge sharing operation and an amplification operation are performed after the equilibrium state reflecting the offset of the first inverter 210 and the second inverter 220 is stored in the bit line BL and the bit line bar BLB through the first phase operation, the bit line sense amplifier 200 may perform an amplification operation accurately. In short, the offset voltage of the bit line sense amplifier 200 of FIG. 2 may be lower than the offset voltage of the bit line sense amplifier 100 shown in FIG. 1.

With the structure of the bit line sense amplifier 200 shown in FIG. 2, the offset voltage of the bit line sense amplifier 200 may be decreased. However, an issue may arise in that the median value of the offset may vary greatly according to variation in the fabrication process of transistors 211, 212, 221, and 222.

FIG. 3 illustrates an offset distribution of the bit line sense amplifier 100 of FIG. 1 and an offset distribution of the bit line sense amplifier 200 of FIG. 2. In FIG. 3, a reference numeral '301' may indicate the offset of the bit line sense amplifier 100. Although the distribution of the offset is wide-spread, the center of the offset is at the level of a bit line pre-charge voltage. In FIG. 3, reference numerals '302', '303' and '304' may represent the offsets of the bit line sense amplifier 200 according to variation in the fabrication process. Referring to the reference numerals '302', '303' and '304', the offset distributions of the bit line sense amplifier 200 are relatively small, when compared with the bit line sense amplifier 100, but it is noted that the centers of the offsets, i. e., the median value of the offsets, vary inconsistently as shown in '302', '303' and '304' due to variation in the fabrication process of the transistors 211, 212, 221, and 222.

SUMMARY

Embodiments of the present invention are directed to an integrated circuit capable of controlling the median value of the offset as desired while decreasing the offset distribution of the amplifier circuit.

In accordance with an embodiment of the present invention, an integrated circuit includes: an amplifier circuit that includes a first inverter and a second inverter to amplify a voltage difference between a first line and a second line; a replica amplifier circuit that includes a first replica inverter having an input terminal and an output terminal which are coupled to a second replica line and replicating the first inverter, and that includes a second replica inverter having an input terminal and an output terminal which are coupled to a first replica line and replicating the second inverter; and a current control circuit suitable for controlling an amount of a current sourced to the replica amplifier circuit and an amount of a current sunken from the replica amplifier circuit based on comparison of an average voltage level of a voltage of the first replica line and a voltage of the second replica line with a level of a target voltage.

An amount of a current sourced to the amplifier circuit may be controlled to be the same as the amount of the current sourced to the replica amplifier circuit, and an amount of a current sunken from the amplifier circuit may be controlled to be the same as the amount of the current sunken from the replica amplifier circuit.

During an offset cancellation operation for compensating the offset caused by mismatch, the input terminal and the output terminal of the first inverter may be coupled to the second line, and the input terminal and the output terminal of the second inverter may be coupled to the first line, and during an amplification operation of the amplifier circuit, the first inverter and the second inverter may be coupled to each other in a cross-coupled form between the first line and the second line.

When the average voltage level of a voltage of the first replica line and a voltage of the second replica line is lower than the level of the target voltage, the current control circuit may increase the amount of the current sourced to the replica amplifier circuit and decrease the amount of the current sunken from the replica amplifier circuit, and when the average voltage level of the voltage of the first replica line and the voltage of the second replica line is higher than the level of the target voltage, the current control circuit may decrease the amount of the current sourced to the replica amplifier circuit and increase the amount of the current sunken from the replica amplifier circuit.

The current control circuit may generate a first bias voltage for controlling the amount of the current sourced to the replica amplifier circuit and the amount of the current sunken from the replica amplifier circuit, and a level of the first bias voltage may be controlled based on a comparison result between the average level and the level of the target voltage.

The integrated circuit may further include: a replica sinking unit suitable for sinking a current from the replica amplifier circuit in response to the first bias voltage; a second bias voltage generation unit suitable for generating a second bias voltage that is decreased when the level of the first bias voltage is raised and increased when the level of the first bias voltage is lowered; and a replica sourcing unit suitable for sourcing a current to the replica amplifier circuit in response to the second bias voltage.

The integrated circuit may further include: a sinking unit suitable for controlling the amount of the current sunken from the amplifier circuit based on the first bias voltage; and a sourcing unit suitable for controlling the amount of the current sourced to the amplifier circuit based on the second bias voltage.

The integrated circuit may further include: a first voltage follower suitable for applying the first bias voltage generated in the current control circuit to the sinking unit; and a second voltage follower suitable for applying the second bias voltage generated in the second bias voltage generation unit to the sourcing unit.

The input terminal of the first inverter may be coupled to the second line, and the input terminal of the second inverter may be coupled to the first line, and the amplifier circuit may further include: a first switch suitable for electrically connecting the input terminal of the first inverter and the output terminal of the first inverter to each other in a first phase; a second switch suitable for electrically connecting the input terminal of the second inverter and the output terminal of the second inverter to each other in the first phase; a third switch suitable for electrically connecting the output terminal of the first inverter and the first line to each other in the second phase; and a fourth switch suitable for electrically connecting the output terminal of the second inverter and the second line to each other in the second phase, and an operation for cancelling offsets of the first inverter and the second inverter may be performed in the first phase, and an amplification operation for amplifying a voltage difference between the first line and the second line may be performed in the second phase.

The input terminal of the first replica inverter may be coupled to the second replica line, and the input terminal of the second replica inverter may be coupled to the first replica line, and the replica amplifier circuit may further include: a first replica switch suitable for electrically connecting the input terminal of the first replica inverter and the output terminal of the first replica inverter to each other; a second replica switch suitable for electrically connecting the input terminal of the second replica inverter and the output terminal of the second replica inverter to each other; a third replica switch suitable for electrically connecting the output terminal of the first replica inverter and the first replica line to each other; and a fourth replica switch suitable for electrically connecting the output terminal of the second replica inverter and the second replica line to each other, and the first replica switch and the second replica switch may be controlled to be turned on, and the third replica switch and the fourth replica switch may be controlled to be turned off.

The current control circuit may include: a first PMOS transistor suitable for supplying a current to a pull-up node in response to a pull-up bias voltage; a first resistor having a first end coupled to the pull-up node; a second PMOS transistor suitable for electrically connecting a second end of the first resistor and a first pull-down node to each other in response to the target voltage; a second resistor having a first end coupled to the pull-up node; a third PMOS transistor suitable for electrically connecting a second end of the second resistor and a second pull-down node to each other in response to a voltage of the first replica line; a third resistor having a first end coupled to the pull-up node; a fourth PMOS transistor suitable for electrically connecting a second end of the third resistor and the second pull-down node to each other in response to a voltage of the second replica line; a first NMOS transistor suitable for sinking a current from the first pull-down node in response to a pull-down bias voltage; a second NMOS transistor suitable for sinking a current from the second pull-down node in response to the pull-down bias voltage; and an operation amplifier suitable for receiving an input from the first pull-down node and the second pull-down node and outputs the first bias voltage.

The integrated circuit may be a semiconductor device, and the first line and the second line may be a bit line and a bit line bar, and the amplifier circuit may be a bit line sense amplifier.

The current control circuit may generate a first code for controlling the amount of the current sunken from the replica amplifier circuit, and a second code for controlling the amount of the current sourced to the replica amplifier circuit, and the first code and the second code may be controlled based on a comparison result between the average level and the level of the target voltage.

The integrated circuit may further include: a replica sinking unit suitable for sinking a current from the replica amplifier circuit in response to the first code; a replica sourcing unit suitable for sourcing a current to the replica amplifier circuit in response to the second code; a sinking unit suitable for controlling the amount of the current sunken from the amplifier circuit in response to the first code; and a sourcing unit suitable for controlling the amount of the current sourced to the amplifier circuit in response to the second code.

The current control circuit may include: a first PMOS transistor suitable for supplying a current to a pull-up node in response to a pull-up bias voltage; a first resistor having a first end coupled to the pull-up node; a second PMOS transistor suitable for electrically connecting a second end of the first resistor and a first pull-down node to each other in response to the target voltage; a second resistor having a first end coupled to the pull-up node; a third PMOS transistor suitable for electrically connecting a second end of the second resistor and a second pull-down node to each other in response to a voltage of the first replica line; a third resistor having a first end coupled to the pull-up node; a fourth PMOS transistor suitable for electrically connecting a second end of the third resistor and the second pull-down node to each other in response to a voltage of the second replica line; a first NMOS transistor suitable for sinking a current from the first pull-down node in response to a pull-down bias voltage; a second NMOS transistor suitable for sinking a current from the second pull-down node in response to the pull-down bias voltage; an operation amplifier suitable for receiving an input from the first pull-down node and the second pull-down node and outputs the first bias voltage; and an analog-to-digital converter suitable for generating the first code and the second code in response to the first bias voltage.

In accordance with another embodiment of the present invention, an integrated circuit includes: an amplifier circuit that includes a first NMOS transistor for pulling down a first output node in response to a voltage level of a first line, a second NMOS transistor for pulling down a second output node in response to a voltage level of a second line, a first PMOS transistor for pulling up the first output node in response to a voltage level of the second output node, and a second PMOS transistor for pulling up the second output node in response to a voltage level of the first output node, wherein the first output node and the second line are electrically connected to each other, and the second output node and the first line are electrically connected to each other during an amplification operation, and wherein the first output node and the first line are electrically connected to each other, and the second output node and the second line are electrically connected to each other during an offset cancellation operation; a replica amplifier circuit that includes a first replica NMOS transistor for pulling down a first replica output node in response to a voltage level of a first replica line, a second replica NMOS transistor for pulling down a second replica output node in response to a voltage level of a second replica line, a first replica PMOS transistor for pulling up the first replica output node in response to a voltage level of the second replica output node, and a second replica PMOS transistor for pulling up the second replica output node in response to a voltage level of the first replica output node, wherein the first replica output node and the first replica line are electrically connected to each other, and the second replica output node and the second replica line are electrically connected to each other; and a current control circuit suitable for controlling an amount of a current sourced to the replica amplifier circuit and an amount of a current sunken from the replica amplifier circuit based on comparison of an average level between a voltage of the first replica line and a voltage of the second replica line with a level of a target voltage.

The amount of a current sourced to the amplifier circuit may be controlled to be the same as the amount of the current sourced to the replica amplifier circuit, and the amount of a current sunken from the amplifier circuit may be controlled to be the same as the amount of the current sunken from the replica amplifier circuit.

When the average level is lower than the level of the target voltage, the current control circuit may increase the amount of the current sourced to the replica amplifier circuit and decrease the amount of the current sunken from the replica amplifier circuit, and when the average level is higher than the level of the target voltage, the current control circuit may decrease the amount of the current sourced to the replica amplifier circuit and increase the amount of the current sunken from the replica amplifier circuit.

The integrated circuit may be a semiconductor device, and the first line and the second line may be a bit line and a bit line bar, and the amplifier circuit may be a bit line sense amplifier.

DETAILED DESCRIPTION

Figure 1:
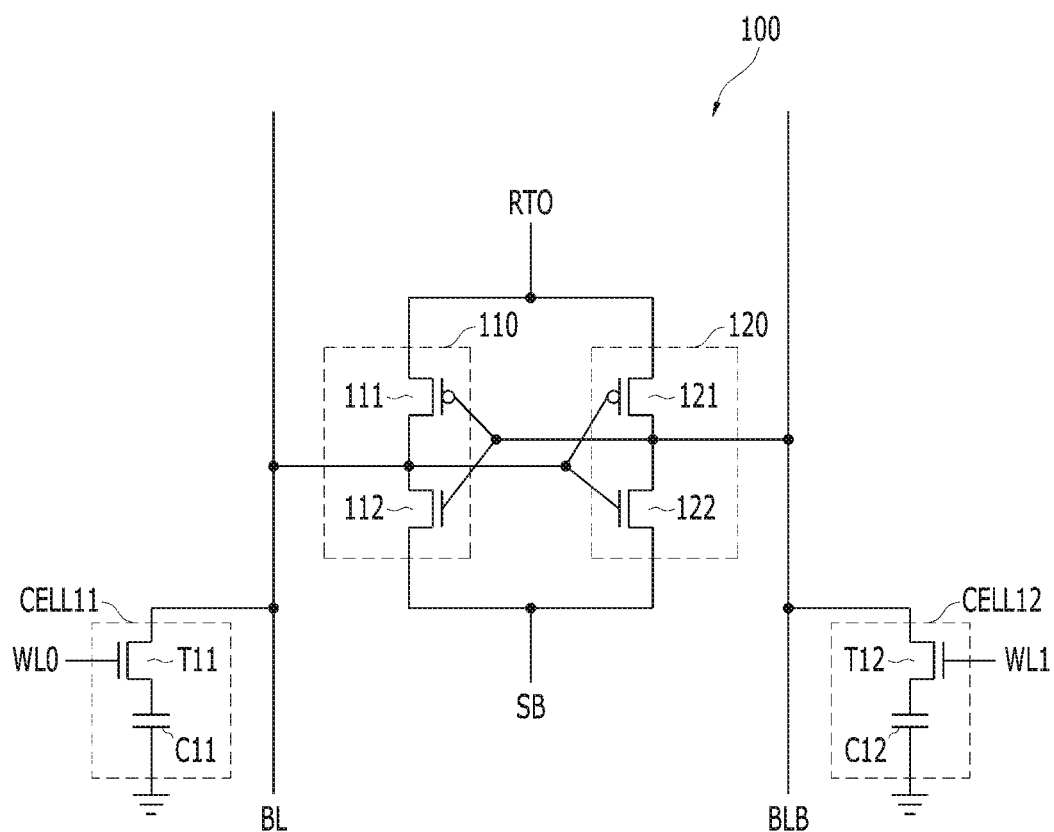
FIG. 1 is a schematic diagram illustrating a conventional bit line sense amplifier 100.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

Hereinafter, the various embodiments of the present invention will be described in detail with reference to the attached drawings.

Figure 4:
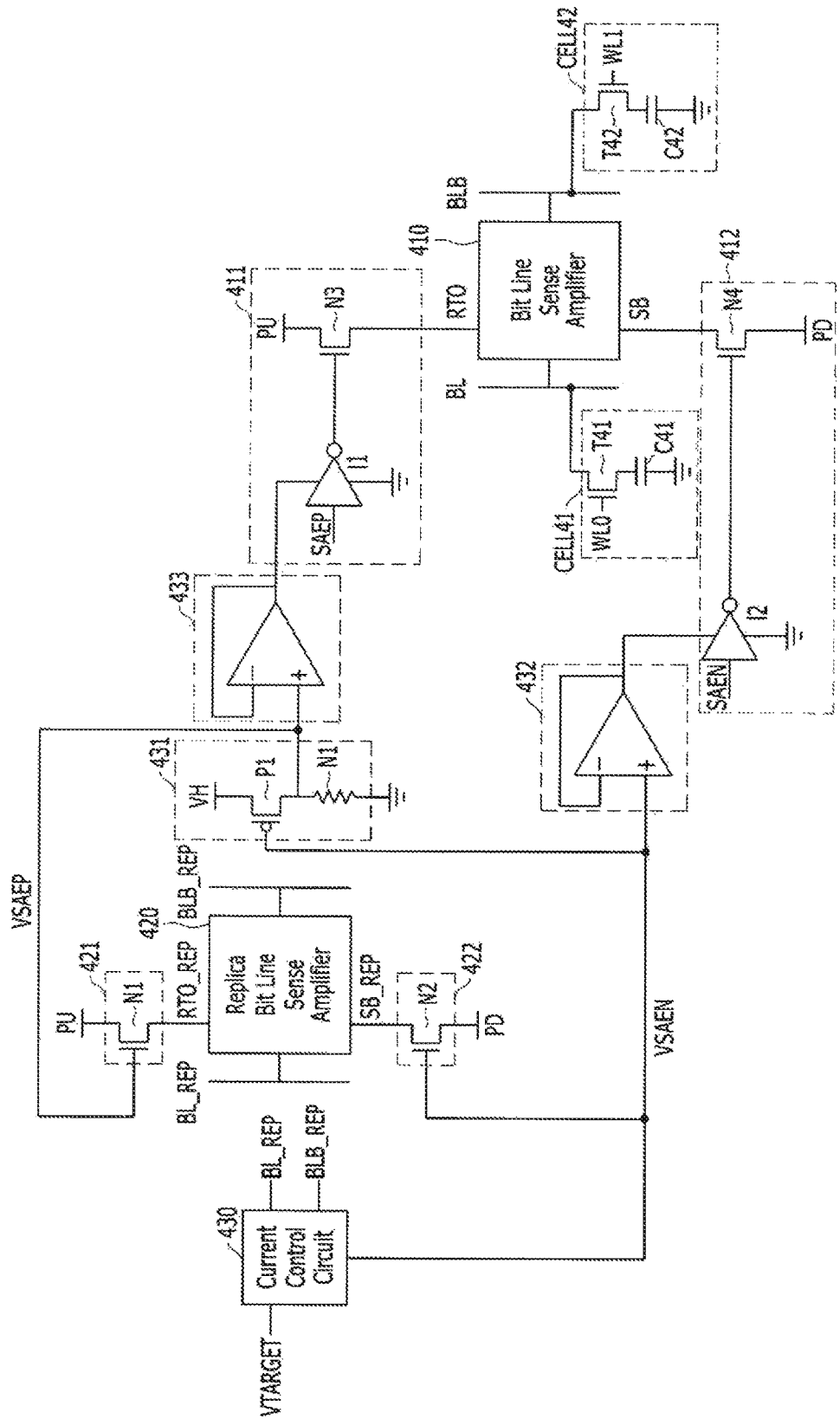
FIG. 4 is a schematic diagram illustrating a semiconductor device in accordance with an embodiment of the present invention.
Figure 5:
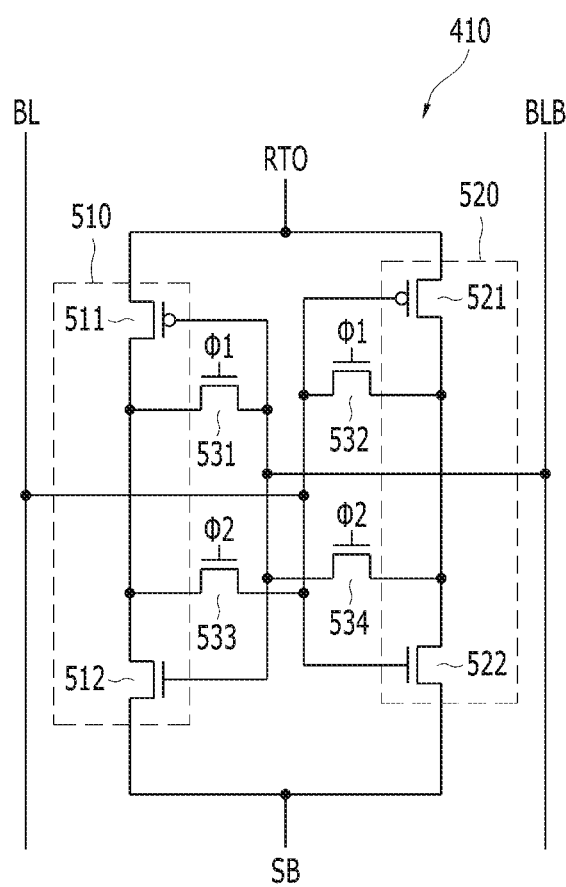
FIG. 5 is a schematic diagram illustrating a bit line sense amplifier 410 of FIG. 4.
Figure 6:
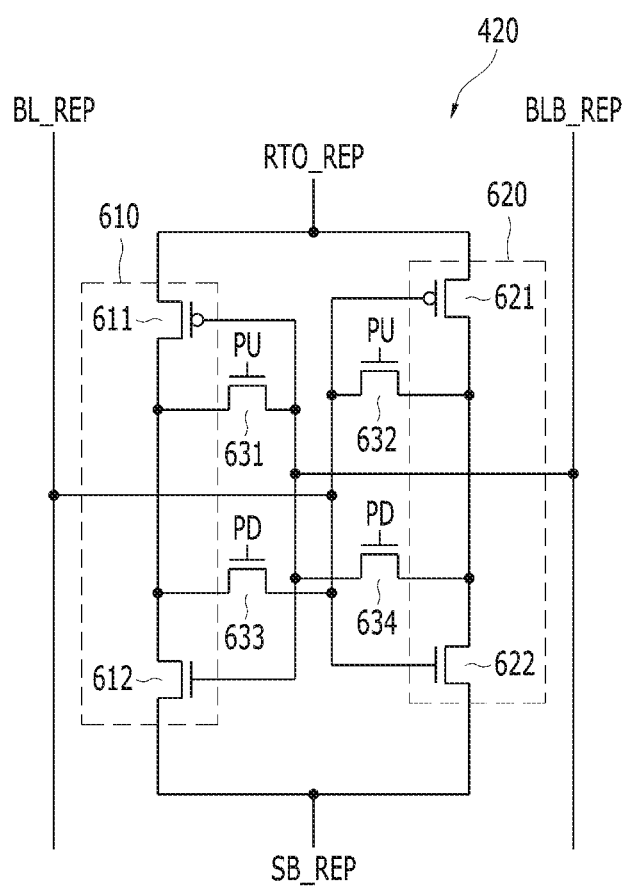
FIG. 6 is a schematic diagram illustrating a replica bit line sense amplifier 420 of FIG. 4.
Figure 8:
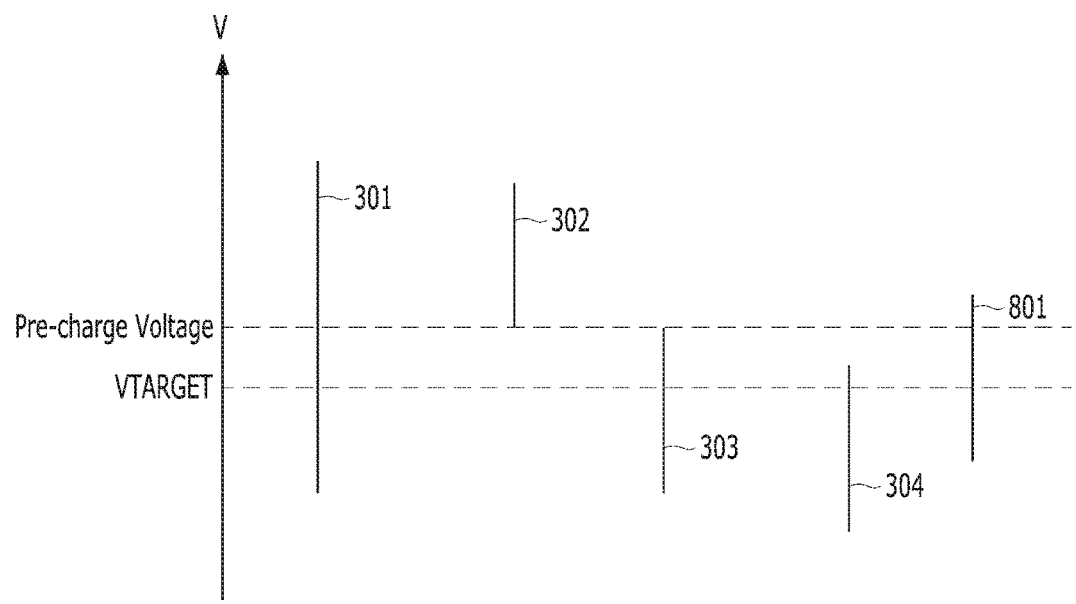
FIG. 8 illustrates an offset of the bit line sense amplifier 410 shown in FIG. 4.

FIG. 4 is a schematic diagram illustrating a semiconductor device in accordance with an embodiment of the present invention. FIG. 5 is a schematic diagram illustrating a bit line sense amplifier 410 of FIG. 4. FIG. 6 is a schematic diagram illustrating a replica bit line sense amplifier 420 of FIG. 4. FIG. 8 illustrates an offset of the bit line sense amplifier 410 shown in FIG. 4. Referring to FIG. 4, the semiconductor device may include a bit line sense amplifier 410, a replica bit line sense amplifier 420, a current control circuit 430, a sourcing unit 411, a sinking unit 412, a replica sourcing unit 421, a replica sinking unit 422, a second bias voltage generation unit 431, a first voltage follower 432, a second voltage follower 433, and memory cells CELL41 and CELL42.

The bit line sense amplifier 410 may amplify the voltage difference between the bit line BL and the bit line bar BLB, and sense the data in a memory cell that is selected between the memory cells CELL41 and CELL42. FIG. 5 may show the configuration of the big line sense amplifier 410 according to one exemplary embodiment.

Figure 2:
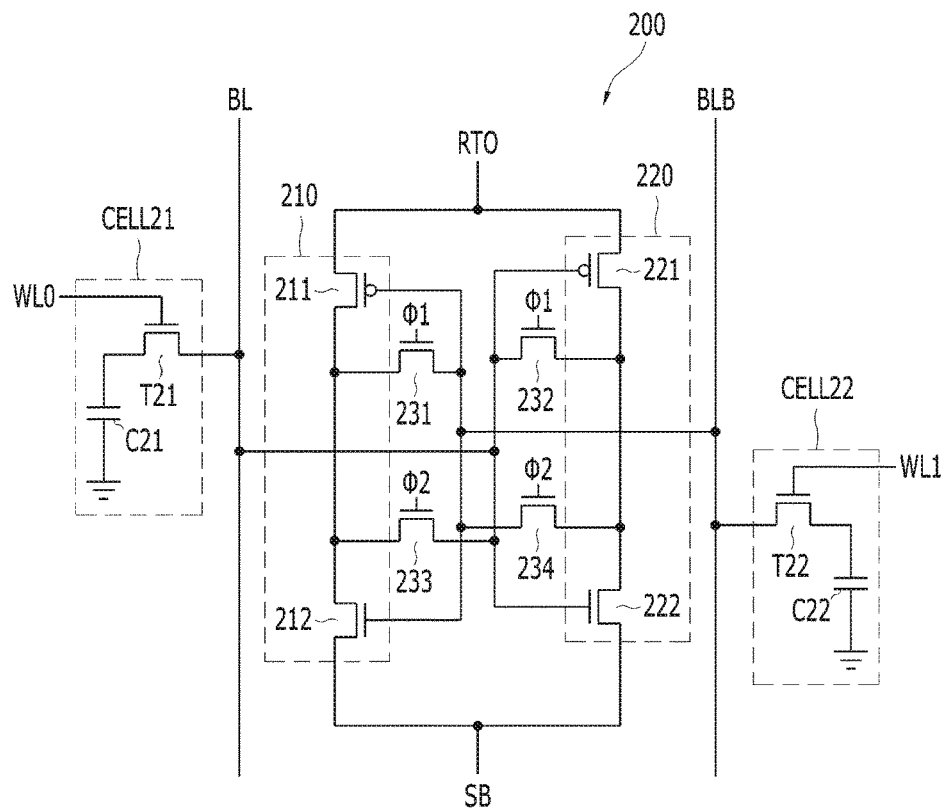
FIG. 2 is a schematic diagram illustrating a conventional bit line sense amplifier 200 the offset of which caused by mismatch is improved.
Figure 3:
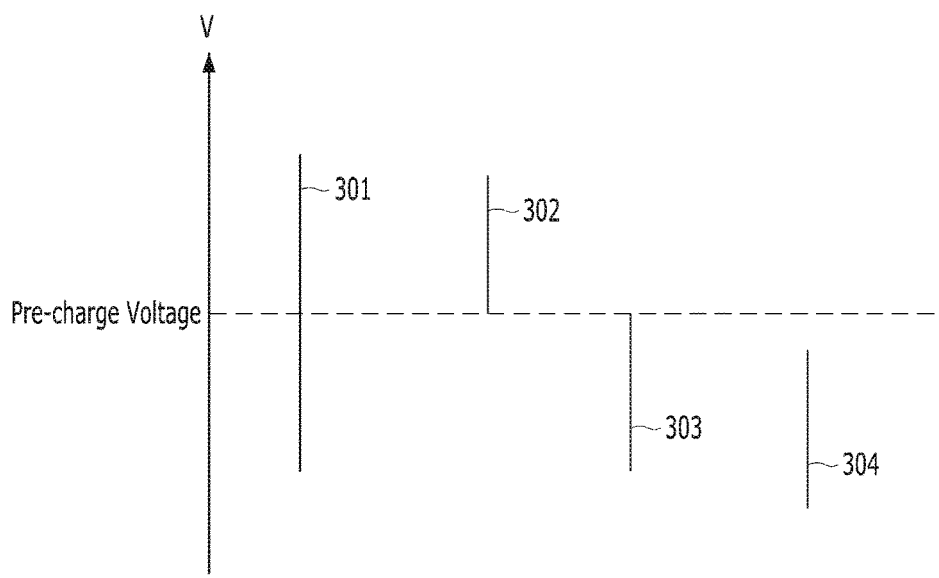
FIG. 3 illustrates an offset distribution of the conventional bit line sense amplifier 100 of FIG. 1 and an offset distribution of the conventional bit line sense amplifier 200 of FIG. 2.

Referring to FIG. 5, the bit line sense amplifier 410 may include a first inverter 510, a second inverter 520, and first to fourth switches 531 to 534, similar to that of the bit line sense amplifier 200 of FIG. 2. Also, the bit line sense amplifier 410 may perform a pre-charge operation, a first phase operation, a charge sharing operation, and a second phase operation, similar to that of the bit line sense amplifier 200 of FIG. 2.

Referring back to FIG. 4, the sourcing unit 411 may source a current to a pull-up voltage terminal RTO of the bit line sense amplifier 410 with a pull-up voltage PU. The sourcing unit 411 may include an inverter I1 and an NMOS transistor N3. When a pull-up power source supplying signal SAEP is enabled to a logic low level, the sourcing unit 411 may source a current to the pull-up voltage terminal RTO. Since a second bias voltage VSAEP is used as a voltage for controlling the NMOS transistor N3, when the pull-up power source supplying signal SAEP is enabled, the amount of the current that the sourcing unit 411 supplies to the bit line sense amplifier 410 may be controlled according to the level of the second bias voltage VSAEP. The pull-up power source supplying signal SAEP may be enabled in a section where the bit line sense amplifier 410 needs to be enabled. For example, the pull-up power source supplying signal SAEP may be enabled during the first phase operation and the second phase operation of the bit line sense amplifier 410. The sourcing unit 411 may be a component for controlling the amount of current supplied to the bit line sense amplifier 410 according to the level of the second bias voltage VSAEP. Although the sourcing unit 411 may have an exemplary configuration as shown in FIG. 4, one skilled in the art will appreciate that any suitable component configured to control the amount of current supplied to the bit line sense amplifier 410 according to the level of the second bias voltage VSAEP may be used according to various embodiments.

The sinking unit 412 may sink a current from the pull-down voltage terminal SB of the bit line sense amplifier 410 by using the pull-down voltage PD. The sinking unit 412 may include an inverter I2 and an NMOS transistor N4. The sinking unit 412 may sink a current from the pull-down voltage terminal SB, when the pull-down power source supplying signal SAEN is enabled to a logic low level. Since a first bias voltage VSAEN is used as a voltage for controlling the NMOS transistor N4, the amount of current that the sinking unit 412 sinks from the bit line sense amplifier 410 may be controlled according to the level of the first bias voltage VSAEN when the pull-down power source supplying signal SAEN is enabled. The pull-down power source supplying signal SAEN may be enabled in a section where the bit line sense amplifier 410 needs to be enabled. For example, the pull-down power source supplying signal SAEN may be enabled during the first phase operation and the second phase operation of the bit line sense amplifier 410. As for the pull-down voltage PD, a ground voltage may be used. The sinking unit 412 may control the amount of current that is sunken from the bit line sense amplifier 410 according to the level of the first bias voltage VSAEN. Although the sinking unit 412 may have an exemplary configuration as shown in FIG. 4, one skilled in the art will appreciate that any suitable component configured to control the amount of current supplied to the bit line sense amplifier 410 according to the level of the first bias voltage VSAEN may be used according to various embodiments.

Referring to FIG. 6, the replica bit line sense amplifier 420 may be a replica of the bit line sense amplifier 410. The replica bit line sense amplifier 420 may be formed as shown in FIG. 6. The replica bit line sense amplifier 420 may include a first replica inverter 610, a second replica inverter 620, and first to fourth replica switches 631 to 634. The replica bit line sense amplifier 420 may be controlled in a first phase. In short, the pull-up voltage PU may be applied to the first and second replica switches 631 and 632 to turn on the first and second replica switches 631 and 632, and the pull-down voltage PD may be applied to the third and fourth replica switches 633 and 634 to turn off the replica third and fourth switches 633 and 634. In short, the input terminal and the output terminal of the first replica inverter 610 may be electrically connected to a replica bit line bar BLB_REP, and the input terminal and the output terminal of the second replica inverter 620 may be electrically connected to a replica bit line BL_REP.

Referring back to FIG. 4, the replica sourcing unit 421 may source a current to a replica pull-up voltage terminal RTO_REP in response to the second bias voltage VSAEP. The replica sourcing unit 421 may include an NMOS transistor N1. As the level of the second bias voltage VSAEP is raised, the amount of the current sourced by the replica sourcing unit 421 may be increased, and, as a result, the voltage level of the replica pull-up voltage terminal RTO_REP may be increased. As the level of the second bias voltage VSAEP is decreased, the amount of the current sourced by the replica sourcing unit 421 may be decreased, and, as a result, the voltage level of the replica pull-up voltage terminal RTO_REP may be decreased.

The replica sinking unit 422 may sink a current from a replica pull-down voltage terminal SB_REP in response to the first bias voltage VSAEN. The replica sinking unit 422 may include an NMOS transistor N2. As the level of the first bias voltage VSAEN is raised, the amount of the current sunken by the replica sinking unit 422 may be increased, and, as a result, the voltage level of the replica pull-down voltage terminal SB_REP may be decreased. As the level of the first bias voltage VSAEN is decreased, the amount of the current sunken by the replica sinking unit 422 may be decreased, and, as a result, the voltage level of the replica pull-down voltage terminal SB_REP may be decreased.

The current control circuit 430 may control the amount of the current sourced to the replica bit line sense amplifier 420 and the amount of the current sunken from the replica bit line sense amplifier 420 by comparing an average voltage level of the voltage of the replica bit line BL_REP and the voltage of the replica bit line bar BLB_REP with the level of a target voltage VTARGET. When the average voltage level of the voltage of the replica bit line BL_REP and the voltage of the replica bit line bar BLB_REP is lower than the level of the target voltage VTARGET, the current control circuit 430 may control the average voltage level to be raised by increasing the amount of the current sourced to the replica bit line sense amplifier 420 and decreasing the amount of the current sunken from the replica bit line sense amplifier 420. Also, when the average voltage level of the voltage of the replica bit line BL_REP and the voltage of the replica bit line bar BLB_REP is higher than the level of the target voltage VTARGET, the current control circuit 430 may control the average voltage level to be lowered by decreasing the amount of the current sourced to the replica bit line sense amplifier 420 and increasing the amount of the current sunken from the replica bit line sense amplifier 420. In short, the current control circuit 430 may control the amount of the current sourced to the replica bit line sense amplifier 420 and the amount of the current sunken from the replica bit line sense amplifier 420 in such a manner that the average voltage level of the voltage of the replica bit line BL_REP and the voltage of the replica bit line bar BLB_REP becomes the same as the level of the target voltage VTARGET. Herein, the target voltage VTARGET may be a target value of the median value of the offsets of the bit line sense amplifier 410.

The current control circuit 430 may control the amount of the current sourced to the replica bit line sense amplifier 420 and the amount of the current sunken from the replica bit line sense amplifier 420 by generating the first bias voltage VSAEN. The current control circuit 430 may increase the amount of the current sourced to the replica bit line sense amplifier 420 and decrease the amount of the current sunken from the replica bit line sense amplifier 420 by decreasing the level of the first bias voltage VSAEN. Also, the current control circuit 430 may decrease the amount of the current sourced to the replica bit line sense amplifier 420 and increase the amount of the current sunken from the replica bit line sense amplifier 420 by increasing the level of the first bias voltage VSAEN. An exemplary configuration of the current control circuit will be described in detail with reference to FIG. 7 below.

The second bias voltage generation unit 431 may generate the second bias voltage VSAEP based on the first bias voltage VSAEN. The second bias voltage generation unit 431 may generate the second bias voltage VSAEP in such a manner that when the level of the first bias voltage VSAEN is decreased, the level of the second bias voltage VSAEP may be increased and that when the level of the first bias voltage VSAEN is increased, the level of the second bias voltage VSAEP may be decreased. Therefore, when the amount of the current sunken from the replica bit line sense amplifier 420 is increased, the amount of the current sourced to the replica bit line sense amplifier 420 may be decreased. Conversely, when the amount of the current sunken from the replica bit line sense amplifier 420 is decreased, the amount of the current sourced to the replica bit line sense amplifier 420 may be increased. The second bias voltage generation unit 431 may include, e.g., a PMOS transistor P1 and a resistor R. As the level of the first bias voltage VSAEN becomes low, the PMOS transistor P1 may be turned on to a greater extent so as to increase the level of the second bias voltage VSAEP. Also, as the level of the first bias voltage VSAEN becomes high, the PMOS transistor P1 may be turned on to a lesser extent so as to decrease the level of the second bias voltage VSAEP. A high voltage VH the level of which is higher than the pull-up voltage PU may be applied to the source of the PMOS transistor P1. In accordance with one exemplary embodiment, the sourcing unit 411 uses an NMOS transistor N1 as a transistor for pull-up, and thus a loss may occur in the process of delivering a current. Therefore, the level of the second bias voltage VSAEP for controlling the NMOS transistor N1 may need to be set high, and a high voltage VH that is higher than the pull-up voltage PU may be applied to the source of the PMOS transistor P1. For example, when the first bias voltage VSAEN varies in the range of approximately 0.5 to 1V, the second bias voltage VSAEP may vary in the range of approximately 2 to 1.5V.

The first voltage follower 432 may transfer the first bias voltage VSAEN generated in the current control circuit 430 to the sinking unit 412, and the second voltage follower 433 may transfer the second bias voltage VSAEP generated in the second bias voltage generation unit 431 to the sourcing unit 411. Therefore, the amount of the current sourced to the bit line sense amplifier 410 while the bit line sense amplifier 410 is enabled may be the same as the amount of the current sourced to the replica bit line sense amplifier 420, and the amount of the current sunken from the bit line sense amplifier 410 while the bit line sense amplifier 410 is enabled may be the same as the amount of the current sunken from the replica bit line sense amplifier 420.

An exemplary operation of the semiconductor device shown in FIG. 4 according to one embodiment is described as follows: the replica bit line sense amplifier 420 is maintained in the first phase, and the current control circuit 430 may control the amount of the current sourced to the replica bit line sense amplifier 420 and the amount of the current sunken from the replica bit line sense amplifier 420 in such a manner that the average level between the voltage of the replica bit line BL_REP and the voltage of the replica bit line bar BLB_REP becomes the same as the level of the target voltage VTARGET. The amount of the current sourced to the bit line sense amplifier 410 while the bit line sense amplifier 410 is enabled may be the same as the amount of the current sourced to the replica bit line sense amplifier 420, and the amount of the current sunken from the bit line sense amplifier 410 while the bit line sense amplifier 410 is enabled may be the same as the amount of the current sunken from the replica bit line sense amplifier 420. Therefore, the median value of the offset of the replica bit line sense amplifier 420 may become the same as the target voltage VTARGET.

Referring to FIG. 8, a reference numeral '801' may represent the offset value of the bit line sense amplifier 410. For comparison, the reference numerals '302', '303' and '303' are shown together. Herein, although the target voltage VTARGET is exemplarily illustrated to be lower than the level of the bit line pre-charge voltage, one skilled in the art will appreciate that the target voltage VTARGET may be the same as the level of the bit line pre-charge voltage and be higher than the level of the bit line pre-charge voltage as well.

Figure 7:
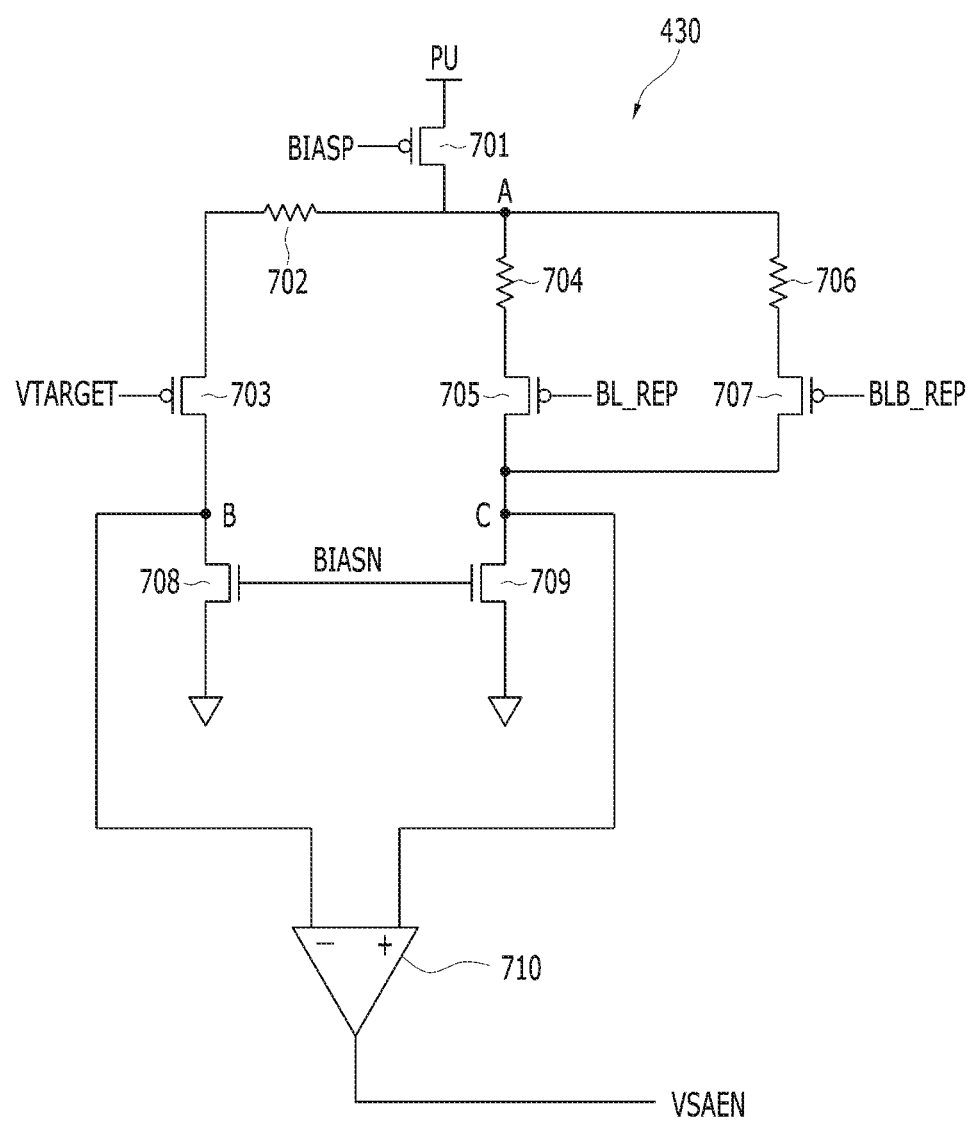
FIG. 7 is a schematic diagram illustrating a current control circuit 430 of FIG. 4.

FIG. 7 is a schematic diagram illustrating an exemplary configuration of the current control circuit 430 of FIG. 4.

Referring to FIG. 7, the current control circuit 430 may include a PMOS transistor 701, a resistor 702, a PMOS transistor 703, a resistor 704, a PMOS transistor 705, a resistor 706, a PMOS transistor 707, an NMOS transistor 708, an NMOS transistor 709, and an operation amplifier 710.

The PMOS transistor 701 may supply a current to a pull-up node A in response to a pull-up bias voltage BIASP. The resistor 702 may have a first end that is coupled to the pull-up node A. The PMOS transistor 703 may electrically connect a second end of the resistor 702 to a pull-down node B in response to the target voltage VTARGET. The resistor 704 may have a first end that is coupled to the pull-up node A. The PMOS transistor 705 may electrically connect a second end of the resistor 704 to a pull-down node C in response to a voltage of the replica bit line BL_REP. The resistor 706 may have a first end that is coupled to the pull-up node A. The PMOS transistor 707 may electrically connect a second end of the resistor 706 to a pull-down node C in response to a voltage of the replica bit line bar BLB_REP. The NMOS transistor 708 may sink a current from the pull-down node B in response to a pull-down bias voltage BIASN. The NMOS transistor 709 may sink a current from the pull-down node C in response to a pull-down bias voltage BIASN. The operation amplifier 710 may receive an input from the pull-down node B and the pull-down node C and output the first bias voltage VSAEN.

The width of the PMOS transistor 703 may be twice as large as each width of the PMOS transistor 705 and the PMOS transistor 707. The resistor 702 may have a resistance value which is a half of each resistance value of the resistor 704 and the resistor 706. Therefore, the resistors 704 and 706 that are coupled in parallel with respect to the same input and a pair of the PMOS transistor 705 and the PMOS transistor 707 may have substantially similar current characteristics as the resistor 702 and the PMOS transistor 703 on the opposite side. The pull-up bias voltage BIASP and the pull-down bias voltage BIASN may have appropriate voltage levels so that the transistors 701, 708, and 709 may operate in a saturated region.

An exemplary operation of the current control circuit 430 may be described as follows: when the average level between the voltage of the replica bit line BL_REP and the voltage of the replica bit line bar BLB_REP is lower than the target voltage VTARGET, the PMOS transistors 705 and 707 may be turned on to a greater extent than the PMOS transistor 703, and a voltage drop caused by the resistors 704 and 706 is more than a voltage drop caused by the resistor 702. Therefore, the voltage level of the pull-down node C may become lower than the voltage level of the pull-down node B. Therefore, the operation amplifier 710 may decrease the level of the first bias voltage VSAEN.

Conversely, when the average voltage level of the voltage of the replica bit line BL_REP and the voltage of the replica bit line bar BLB_REP is higher than the target voltage VTARGET, the PMOS transistors 705 and 707 may be turned on to a lesser extent than the PMOS transistor 703, and a voltage drop caused by the resistors 704 and 706 is smaller than a voltage drop caused by the resistor 702. Therefore, the voltage level of the pull-down node C may become higher than the voltage level of the pull-down node B. Therefore, the operation amplifier 710 may increase the level of the first bias voltage VSAEN.

Figure 9:
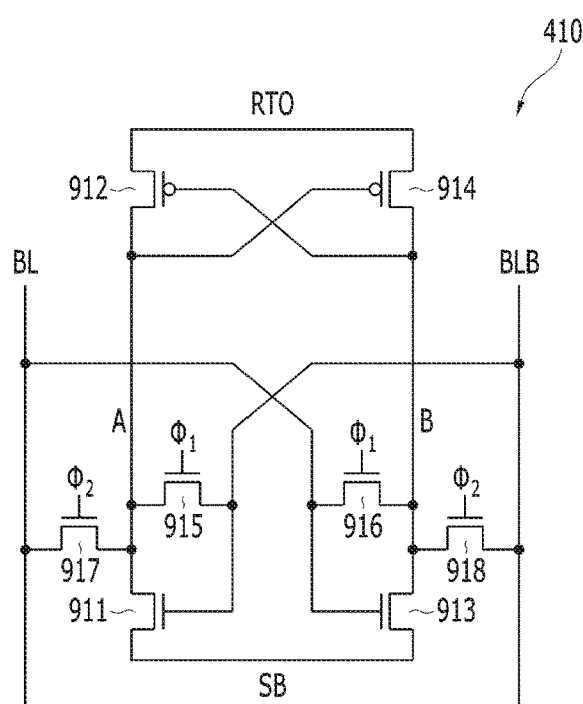
FIG. 9 is a schematic diagram illustrating the bit line sense amplifier 410 of FIG. 4 in accordance with another embodiment of the present invention.
Figure 10:
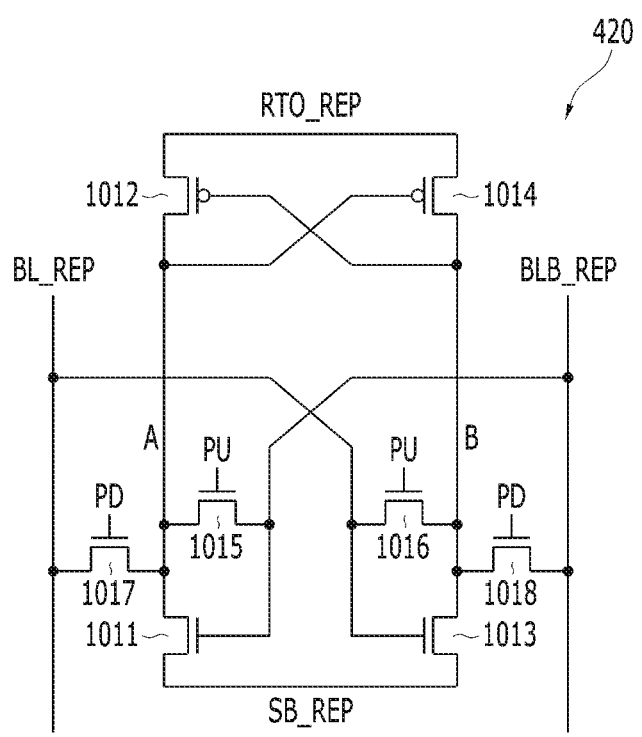
FIG. 10 is a schematic diagram illustrating a replica bit line sense amplifier 420 of FIG. 4 in accordance with another embodiment of the present invention.

FIG. 9 is a schematic diagram illustrating the bit line sense amplifier 410 of FIG. 4 in accordance with another embodiment of the present invention. FIG. 10 is a schematic diagram illustrating a replica bit line sense amplifier 420 of FIG. 4 in accordance with another embodiment of the present invention. When the bit line sense amplifier 410 is formed as shown in FIG. 9, the replica bit line sense amplifier 420 may be formed as shown in FIG. 10.

Referring to FIG. 9, the bit line sense amplifier 410 may include an NMOS transistor 911, an NMOS transistor 913, a PMOS transistor 912, a PMOS transistor 914, a first switch 915, a second switch 916, a third switch 917, and a fourth switch 918. The NMOS transistor 911 may drive a pull-down of a first output node A in response to the voltage level of the bit line bar BLB. The NMOS transistor 913 may drive a pull-down of a second output node B in response to the voltage level of the bit line BL. The PMOS transistor 912 may drive a pull-up of the first output node A in response to the voltage level of the second output node B. The PMOS transistor 914 may drive a pull-up of the second output node B in response to the voltage level of the first output node A. The first switch 915 may electrically connect the bit line bar BLB and the first output node A to each other in response to the first phase signal φ1. The second switch 916 may electrically connect the bit line BL and the second output node B to each other in response to the first phase signal φ1. The third switch 917 may electrically connect the bit line BL and the first output node A to each other in response to the second phase signal φ2. The fourth switch 918 may electrically connect the bit line bar BLB and the second output node B to each other in response to the second phase signal φ2.

The bit line sense amplifier 410 of FIG. 9 may operate in a similar manner as the bit line sense amplifier 410 of FIG. 5. When the first phase signal φ1 is enabled, a voltage reflecting the offset of the NMOS transistor 911 and the PMOS transistor 912 may be stored in the bit line BL, and a voltage reflecting the offset of the NMOS transistor 913 and the PMOS transistor 914 may be stored in the bit line bar BLB. When the second phase signal φ2 is enabled, the voltage difference between the bit line BL and the bit line bar BLB may be amplified by the NMOS transistors 911 and 913 and the PMOS transistors 912 and 914. In short, the bit line sense amplifier 410 of FIG. 9 may have different connections among devices from those of FIG. 5, but it may operate in a similar manner as the bit line sense amplifier 410 of FIG. 5 does.

Referring to FIG. 10, the replica bit line sense amplifier 420 of FIG. 10 may include replica devices 1011 to 1018 that may be substantially the same as the elements 911 to 918 of the bit line sense amplifier 410 of FIG. 9. Since the replica bit line sense amplifier 420 is controlled in the first phase, the pull-up voltage PU may be applied to a first replica switch 1015 and a second replica switch 1016 so as to turn on the first replica switch 1015 and the second replica switch 1016, and the pull-down voltage PD may be applied to a third replica switch 1017 and a fourth replica switch 1018 so as to turn off the third replica switch 1017 and the fourth replica switch 1018.

Figure 11:
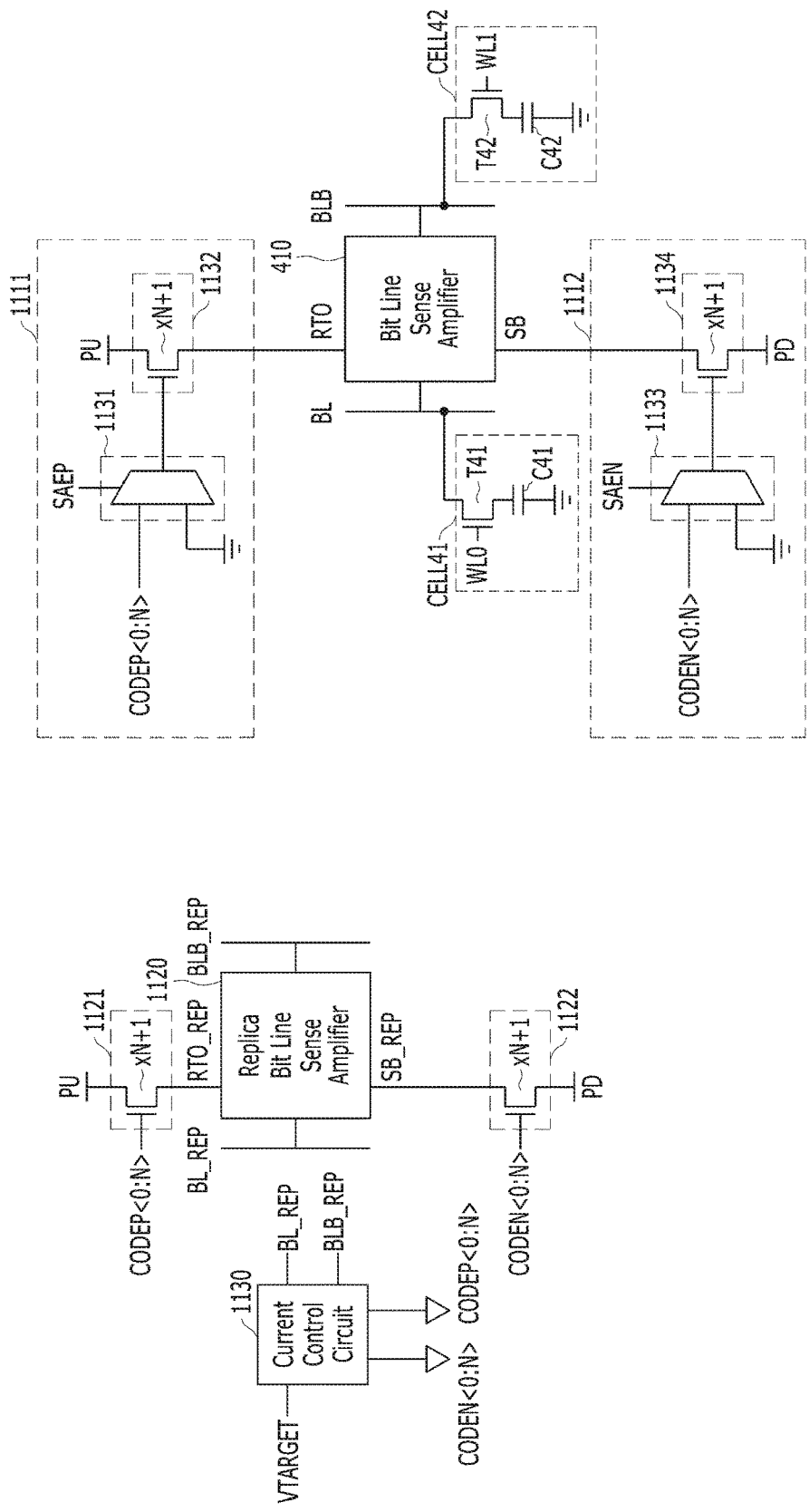
FIG. 11 is a schematic diagram illustrating a semiconductor device in accordance with another embodiment of the present invention.

FIG. 11 is a schematic diagram illustrating a semiconductor device in accordance with another embodiment of the present invention. As opposed to what is shown in FIG. 4, in this embodiment of the present invention, the amount of the current sourced to the bit line sense amplifier 410 and the replica bit line sense amplifier 420 and the amount of the current sunken from the bit line sense amplifier 410 and the replica bit line sense amplifier 420 may be controlled digitally.

Referring to FIG. 11, the semiconductor device may include the bit line sense amplifier 410, the replica bit line sense amplifier 420, a current control circuit 1130, a sourcing unit 1111, a sinking unit 1112, a replica sourcing unit 1121, a replica sinking unit 1122, and memory cells CELL41 and CELL42.

The sourcing unit 1111 may source a current to the pull-up voltage terminal RTO of the bit line sense amplifier 410 based on the pull-up voltage PU. The sourcing unit 1111 may include a multiplexer 1131 and N+1 NMOS transistors 1132, where N is an integer equal to or greater than 1. When the pull-up power source supplying signal SAEP is disabled to a logic high level, the multiplexer 1131 may apply the ground voltage to the N+1 NMOS transistors 1132 to turn off all the N+1 NMOS transistors 1132.

The sinking unit 1112 may sink the current from the pull-down voltage terminal of the bit line sense amplifier 410 based on the pull-down voltage PD. The sinking unit 1112 may include a multiplexer 1133 and N+1 NMOS transistors 1134. When the pull-down power source supplying signal SAEN is enabled to a logic low level, the multiplexer 1133 may apply a first code CODEN<0:N> to the N+1 NMOS transistors 1134 so that the number of transistors, which are turned on among the N+1 NMOS transistors 1134, is controlled based on the first code CODEN<0:N>. In short, the amount of the current sunken from the bit line sense amplifier 410 may be controlled based on the first code CODEN<0:N>. When the pull-down power source supplying signal SAEN is disabled to a logic high level, the multiplexer 1133 may apply the ground voltage to the N+1 NMOS transistors 1134 to turn off all the N+1 NMOS transistors 1134.

The replica sourcing unit 1121 may control the amount of the current sourced to the replica bit line sense amplifier 420 in response to a second code CODEP<0:N>. The replica sourcing unit 1121 may include N+1 NMOS transistors that are turned on/off in response to the second code CODEP<0:N>.

The replica sinking unit 1122 may control the amount of the current sunken from the replica bit line sense amplifier 420 in response to the first code CODEN<0:N>. The replica sinking unit 1122 may include N+1 NMOS transistors that are turned on/off in response to the first code CODEN<0:N>.

The current control circuit 1130 may control the amount of the current sourced to the replica bit line sense amplifier 420 and the amount of the current sunken from the replica bit line sense amplifier 420 by comparing the average voltage level of the voltage of the replica bit line BL_REP and the voltage of the replica bit line bar BLB_REP with the level of a target voltage VTARGET. When the average voltage level of the voltage of the replica bit line BL_REP and the voltage of the replica bit line bar BLB_REP is lower than the level of the target voltage VTARGET, the current control circuit 1130 may control the average voltage level to be raised by increasing the amount of the current sourced to the replica bit line sense amplifier 420 and decreasing the amount of the current sunken from the replica bit line sense amplifier 420. Also, when the average voltage level of the voltage of the replica bit line BL_REP and the voltage of the replica bit line bar BLB_REP is higher than the level of the target voltage VTARGET, the current control circuit 1130 may control the average voltage level to be lowered by decreasing the amount of the current sourced to the replica bit line sense amplifier 420 and increasing the amount of the current sunken from the replica bit line sense amplifier 420. In short, the current control circuit 1130 may control the amount of the current sourced to the replica bit line sense amplifier 420 and the amount of the current sunken from the replica bit line sense amplifier 420 in such a manner that the average voltage level of the voltage of the replica bit line BL_REP and the voltage of the replica bit line bar BLB_REP becomes the same as the level of the target voltage VTARGET. Herein, the target voltage VTARGET may be a target value of the median value of the offsets of the bit line sense amplifier 410.

Figure 12:
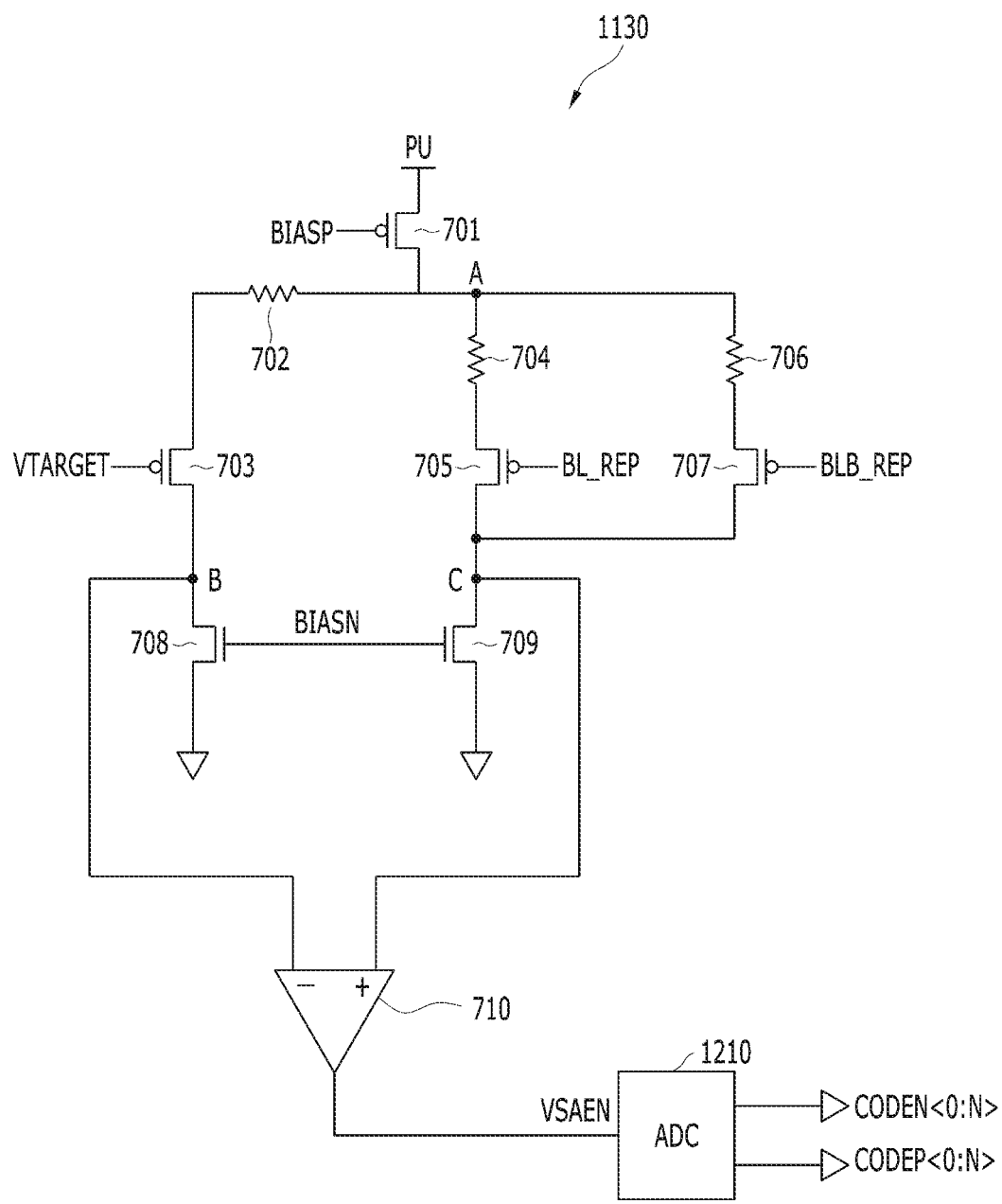
FIG. 12 is a schematic diagram illustrating a current control circuit 1130 shown in FIG. 11.

FIG. 12 is a schematic diagram illustrating the current control circuit 1130 shown in FIG. 11.

Referring to FIG. 12, the current control circuit 1130 may further include an analog-to-digital converter 1210 in addition to the components of the current control circuit 430 of FIG. 7.

The analog-to-digital converter 1210 may convert the first bias voltage VSAEN, which is an analog value, into the first code CODEN<0:N> and the second code CODEP<0:N>, which are digital values. As the level of the first bias voltage VSAEN becomes higher, the analog-to-digital converter 1210 may generate the value of the first code CODEN<0:N> to be high and generate the value of the second code CODEP<0:N> to be low. Also, as the level of the first bias voltage VSAEN becomes lower, the analog-to-digital converter 1210 may generate the value of the first code CODEN<0:N> to be low and generate the value of the second code CODEP<0:N> to be high.

According to the embodiments of the present invention, the median value of offset may be controlled as desired while decreasing the offset distribution of an amplifier circuit.

While the present invention has been described with respect to the specific embodiments, it will be apparent to those skilled in the art that various changes and modifications may be made without departing from the spirit and scope of the invention as defined in the following claims.

In particular, although the above-described embodiments of the present invention exemplarily illustrate the center of the offset of the bit line sense amplifier, which is an amplifier circuit for amplifying the voltage difference between two bit lines, to be controlled into a desired value in the memory device, it is obvious to those skilled in the art that the technology of the present invention may also be applied to controlling the center of an amplifier circuit for amplifying the voltage difference between two bit lines into a desired value in a general integrated circuit which is not a memory device.

What is claimed is:

1. An integrated circuit, comprising:
   an amplifier circuit that includes a first inverter and a second inverter to amplify a voltage difference between a first line and a second line;
   a replica amplifier circuit that includes a first replica inverter having an input terminal and an output terminal which are coupled to a second replica line and replicating the first inverter, and that includes a second replica inverter having an input terminal and an output terminal which are coupled to a first replica line and replicating the second inverter; and
   a current control circuit suitable for controlling an amount of a current sourced to the replica amplifier circuit and an amount of a current sunken from the replica amplifier circuit based on comparison of an average voltage level of a voltage of the first replica line and a voltage of the second replica line with a level of a target voltage.

2. The integrated circuit of claim 1, wherein an amount of a current sourced to the amplifier circuit is controlled to be the same as the amount of the current sourced to the replica amplifier circuit, and
   an amount of a current sunken from the amplifier circuit is controlled to be the same as the amount of the current sunken from the replica amplifier circuit.

3. The integrated circuit of claim 2, wherein during an offset cancellation operation of the amplifier circuit, the input terminal and the output terminal of the first inverter are coupled to the second line, and the input terminal and the output terminal of the second inverter are coupled to the first line, and
   during an amplification operation of the amplifier circuit, the first inverter and the second inverter are coupled to each other in a cross-coupled form between the first line and the second line.

4. The integrated circuit of claim 2, wherein when the average voltage level of the voltage of the first replica line and the voltage of the second replica line is lower than the level of the target voltage, the current control circuit increases the amount of the current sourced to the replica amplifier circuit and decreases the amount of the current sunken from the replica amplifier circuit, and
   when the average voltage level of the voltage of the first replica line and the voltage of the second replica line is higher than the level of the target voltage, the current control circuit decreases the amount of the current sourced to the replica amplifier circuit and increases the amount of the current sunken from the replica amplifier circuit.

5. The integrated circuit of claim 2, wherein the current control circuit generates a first bias voltage for controlling the amount of the current sourced to the replica amplifier circuit and the amount of the current sunken from the replica amplifier circuit, and a level of the first bias voltage is controlled based on a comparison result of the average voltage level with the level of the target voltage.

6. The integrated circuit of claim 5, further comprising:
a replica sinking unit suitable for sinking a current from the replica amplifier circuit in response to the first bias voltage;
a second bias voltage generation unit suitable for generating a second bias voltage that is decreased when the level of the first bias voltage is raised and increased when the level of the first bias voltage is lowered; and
a replica sourcing unit suitable for sourcing a current to the replica amplifier circuit in response to the second bias voltage.

7. The integrated circuit of claim 6, further comprising:
a sinking unit suitable for controlling the amount of the current sunken from the amplifier circuit based on the first bias voltage; and
a sourcing unit suitable for controlling the amount of the current sourced to the amplifier circuit based on the second bias voltage.

8. The integrated circuit of claim 7, further comprising:
a first voltage follower suitable for applying the first bias voltage generated in the current control circuit to the sinking unit; and
a second voltage follower suitable for applying the second bias voltage generated in the second bias voltage generation unit to the sourcing unit.

9. The integrated circuit of claim 5, wherein the current control circuit includes:
a first PMOS transistor suitable for supplying a current to a pull-up node in response to a pull-up bias voltage;
a first resistor having a first end coupled to the pull-up node;
a second PMOS transistor suitable for electrically connecting a second end of the first resistor and a first pull-down node to each other in response to the target voltage;
a second resistor having a first end coupled to the pull-up node;
a third PMOS transistor suitable for electrically connecting a second end of the second resistor and a second pull-down node to each other in response to a voltage of the first replica line;
a third resistor having a first end coupled to the pull-up node;
a fourth PMOS transistor suitable for electrically connecting a second end of the third resistor and the second pull-down node to each other in response to a voltage of the second replica line;
a first NMOS transistor suitable for sinking a current from the first pull-down node in response to a pull-down bias voltage;
a second NMOS transistor suitable for sinking a current from the second pull-down node in response to the pull-down bias voltage; and
an operation amplifier suitable for receiving an input from the first pull-down node and the second pull-down node and outputs the first bias voltage.

10. The integrated circuit of claim 2, wherein the input terminal of the first inverter is coupled to the second line, and the input terminal of the second inverter is coupled to the first line, and
the amplifier circuit further includes:
a first switch suitable for electrically connecting the input terminal of the first inverter and the output terminal of the first inverter to each other in a first phase;
a second switch suitable for electrically connecting the input terminal of the second inverter and the output terminal of the second inverter to each other in the first phase;
a third switch suitable for electrically connecting the output terminal of the first inverter and the first line to each other in the second phase; and
a fourth switch suitable for electrically connecting the output terminal of the second inverter and the second line to each other in the second phase, and
an operation for cancelling offsets of the first inverter and the second inverter is performed in the first phase, and an amplification operation for amplifying a voltage difference between the first line and the second line is performed in the second phase.

11. The integrated circuit of claim 10, wherein the input terminal of the first replica inverter is coupled to the second replica line, and the input terminal of the second replica inverter is coupled to the first replica line, and
the replica amplifier circuit further includes:
a first replica switch suitable for electrically connecting the input terminal of the first replica inverter and the output terminal of the first replica inverter to each other;
a second replica switch suitable for electrically connecting the input terminal of the second replica inverter and the output terminal of the second replica inverter to each other;
a third replica switch suitable for electrically connecting the output terminal of the first replica inverter and the first replica line to each other; and
a fourth replica switch suitable for electrically connecting the output terminal of the second replica inverter and the second replica line to each other, and
the first replica switch and the second replica switch are controlled to be turned on, and the third replica switch and the fourth replica switch are controlled to be turned off.

12. The integrated circuit of claim 2, wherein the integrated circuit is a semiconductor device, and
the first line and the second line are a bit line and a bit line bar, and the amplifier circuit is a bit line sense amplifier.

13. The integrated circuit of claim 2, wherein the current control circuit generates a first code for controlling the amount of the current sunken from the replica amplifier circuit, and a second code for controlling the amount of the current sourced to the replica amplifier circuit, and
the first code and the second code are controlled based on a comparison result between the average voltage level and the level of the target voltage.

14. The integrated circuit of claim 13, further comprising:
a replica sinking unit suitable for sinking a current from the replica amplifier circuit in response to the first code;
a replica sourcing unit suitable for sourcing a current to the replica amplifier circuit in response to the second code;
a sinking unit suitable for controlling the amount of the current sunken from the amplifier circuit in response to the first code; and
a sourcing unit suitable for controlling the amount of the current sourced to the amplifier circuit in response to the second code.

15. The integrated circuit of claim 13, wherein the current control circuit comprises:
a first PMOS transistor suitable for supplying a current to a pull-up node in response to a pull-up bias voltage;
a first resistor having a first end coupled to the pull-up node;
a second PMOS transistor suitable for electrically connecting a second end of the first resistor and a first pull-down node to each other in response to the target voltage;
a second resistor having a first end coupled to the pull-up node;
a third PMOS transistor suitable for electrically connecting a second end of the second resistor and a second pull-down node to each other in response to a voltage of the first replica line;
a third resistor having a first end coupled to the pull-up node;
a fourth PMOS transistor suitable for electrically connecting a second end of the third resistor and the second pull-down node to each other in response to a voltage of the second replica line;
a first NMOS transistor suitable for sinking a current from the first pull-down node in response to a pull-down bias voltage;
a second NMOS transistor suitable for sinking a current from the second pull-down node in response to the pull-down bias voltage;
an operation amplifier suitable for receiving an input from the first pull-down node and the second pull-down node and outputs the first bias voltage; and
an analog-to-digital converter suitable for generating the first code and the second code in response to the first bias voltage.

16. An integrated circuit, comprising:
an amplifier circuit that includes a first NMOS transistor for pulling down a first output node in response to a voltage level of a first line, a second NMOS transistor for pulling down a second output node in response to a voltage level of a second line, a first PMOS transistor for pulling up the first output node in response to a voltage level of the second output node, and a second PMOS transistor for pulling up the second output node in response to a voltage level of the first output node, wherein the first output node and the second line are electrically connected to each other, and the second output node and the first line are electrically connected to each other during an amplification operation, and wherein the first output node and the first line are electrically connected to each other, and the second output node and the second line are electrically connected to each other during an offset cancellation operation;
a replica amplifier circuit that includes a first replica NMOS transistor for pulling down a first replica output node in response to a voltage level of a first replica line, a second replica NMOS transistor for pulling down a second replica output node in response to a voltage level of a second replica line, a first replica PMOS transistor for pulling up the first replica output node in response to a voltage level of the second replica output node, and a second replica PMOS transistor for pulling up the second replica output node in response to a voltage level of the first replica output node, wherein the first replica output node and the first replica line are electrically connected to each other, and the second replica output node and the second replica line are electrically connected to each other; and
a current control circuit suitable for controlling an amount of a current sourced to the replica amplifier circuit and an amount of a current sunken from the replica amplifier circuit based on comparison of an average voltage level of a voltage of the first replica line and a voltage of the second replica line with a level of a target voltage.

17. The integrated circuit of claim 16, wherein the amount of a current sourced to the amplifier circuit is controlled to be the same as the amount of the current sourced to the replica amplifier circuit, and
the amount of a current sunken from the amplifier circuit is controlled to be the same as the amount of the current sunken from the replica amplifier circuit.

18. The integrated circuit of claim 17, wherein when the average voltage level of a voltage of the first replica line and a voltage of the second replica line is lower than the level of the target voltage, the current control circuit increases the amount of the current sourced to the replica amplifier circuit and decreases the amount of the current sunken from the replica amplifier circuit, and
when the average voltage level of the voltage of the first replica line and the voltage of the second replica line is higher than the level of the target voltage, the current control circuit decreases the amount of the current sourced to the replica amplifier circuit and increases the amount of the current sunken from the replica amplifier circuit.

19. The integrated circuit of claim 17, wherein the integrated circuit is a semiconductor device, and
the first line and the second line are a bit line and a bit line bar, and the amplifier circuit is a bit line sense amplifier.

* * * * *